United States Patent [19]
Amano

[11] Patent Number: 6,091,226
[45] Date of Patent: Jul. 18, 2000

[54] VOLTAGE JUDGMENT CIRCUIT AND BATTERY CELL PACK HAVING THE SAME

[75] Inventor: Nobutaka Amano, Tokyo, Japan

[73] Assignee: NEC Corporation, Tokyo, Japan

[21] Appl. No.: 09/265,780

[22] Filed: Mar. 10, 1999

[30]  Foreign Application Priority Data

Mar. 12, 1998 [JP] Japan .................................. 10-060895

[51] Int. Cl.[7] .................................................. H02J 7/00
[52] U.S. Cl. ............................ 320/116; 320/162; 327/77; 327/88
[58] Field of Search .................................. 320/116, 162; 327/77, 88

[56]  References Cited

U.S. PATENT DOCUMENTS

| | | | |
|---|---|---|---|
| 4,978,868 | 12/1990 | Giordano et al. ........................ | 327/108 |
| 5,166,553 | 11/1992 | Kotera et al. ............................ | 327/543 |
| 5,501,517 | 3/1996 | Kiuchi ..................................... | 361/100 |
| 5,731,720 | 3/1998 | Suzuki et al. ............................ | 323/313 |
| 5,760,614 | 11/1995 | Ooishi et al. ............................ | 327/77 |
| 5,982,147 | 11/1995 | Anderson ................................. | 320/116 |

*Primary Examiner*—Edward H. Tso
*Assistant Examiner*—Pia Tibbits
*Attorney, Agent, or Firm*—Scully, Scott, Murphy & Presser

[57]  ABSTRACT

Disclosed herein is a voltage judgment circuit comprising one or more diodes inserted in the forward direction of a judgment voltage, a current extraction section for extracting a forward current of the diodes, and a comparison section for comparing an output current from the current extracting section with a specified current value to input the comparison results. According to the voltage judgment circuit of the present invention, the discharge after the charging can be prevented to perform the voltage judgment using a low consumption current with high accuracy. A battery cell pack having the above voltage judgment circuits also performs a similar judgment.

6 Claims, 5 Drawing Sheets

VOLTAGE JUDGMENT CIRCUIT AND BATTERY CELL PACK HAVING THE SAME

BACKGROUND OF THE INVENTION (a) Field of the Invention

The present invention relates to a voltage judging circuit and a battery cell pack having the same, and more in particular to the voltage judging circuit suitably employed in a battery and the battery pack having the same.

(b) Description of the Related Art

With popularization of a mobile telephone and a portable terminal, the demand for realizing a battery type compact cell increases. A lithium ion battery cell is a known compact cells. For example, a battery cell pack is available having therein a plurality of the lithium ion battery cells connected in series to output a desired voltage.

The battery cell may be destroyed due to excessive charging in the lithium battery cell, and such excessive charging must be prevented. After the voltages of the individual lithium cells in the lithium battery cell pack reach to a specified charged voltage, the overall charging is stopped to prevent the excessive charging. For this purpose, voltage judgment circuits for judging terminal voltages of the battery cells exist in each of the battery cells.

Figs. 1 is a circuit diagram showing a conventional voltage judgment circuit for a battery. The voltage judgment circuit has a differential amplifier OP1 to which a voltage Vin to be judged (hereinafter referred to as "judgment voltage") is input and a comparator CMP1 for comparing an output of the differential amplifier OP1 with a reference voltage Vref. The judgment voltage Vin is input to an inverted input (−) and a non-inverted input (+) through resistances R1 and R3, and an output of the differential amplifier OP1 returns to its inverted input (−) through a resistance R2 by means of negative feedback. The non-inverted input (+) is grounded through a resistance R4.

After the voltage value of the judgment voltage Vin is converted in the differential amplifier OP1 at a specified ratio, it is compared with the reference voltage Vref at the comparator CMP1. When the converted voltage value reaches to the reference voltage Vref, the output (out) of the comparator CMP1 is inverted. When an output of one of the voltage judgment circuits becomes "L" during the charging in the lithium battery cell pack, its charging is stopped.

Since, in the above conventional voltage comparison circuit, the non-inverted terminal of the differential amplifier is grounded through the resistance R4 and voltage differences between the non-inverted terminal and each of the negative terminals of the respective cells are present, the current continues to flow. Due to this reason, the voltage judgment circuit has a large consumption current. In order to make the consumption current at 1 micron A or less in the conventional method, many resistances of 10 M ohm (R1 to R4) are required and the accommodation of these resistances in an integrated circuit is impossible.

In order to elevate the accuracy of the voltage judgment, the high accuracy of the resistance values of the respective resistances R1 to R4 is required. Although the resistance values of the high accuracy are obtained if the respective resistances are separately prepared in addition to integrated circuits constituting the voltage judgment circuit, the circuit scale becomes larger and the cost increases.

SUMMARY OF THE INVENTION

It is, therefore, an object of the present invention to provide a voltage judgment circuit capable of performing voltage judgment with high accuracy without increasing a circuit scale, and a battery cell pack having the voltage judgment circuit which suppresses the consumption of battery cells.

The present invention provides a voltage judgment circuit comprising one or more diodes connected in a forward direction of a voltage to be judged, a current extraction section for extracting a forward current of said diodes, a comparison section for comparing an output current from said current extracting section against a specified current and an output section for outputting a control signal based on the result of comparison.

The judgment whether or not the judgment voltage reaches to a specified voltage can be performed after the judgment voltage is converted into the forward direction current of the diodes which is then compared with a specified reference current. Since the conversion efficiency between the forward direction current and the forward direction voltage of the diodes is high in this case, the voltage judgment with the high accuracy is made possible. Since the forward direction current can be established to be extremely small at the specified voltage or less, a consumption current required for the Judgment can be also made small.

The present invention further provides a battery cell pack comprising a plurality of batteries connected in series, and a plurality of the voltage judgment circuits as defined above arranged corresponding to the respective batteries.

Since a consumption current required for the measurement of a charging voltage is small in the battery cell pack of the present invention, the exhaustion of the battery cells can be suppressed. The circuit scale of the judgment circuit, that is, the whole scale of the battery cell pack can be made smaller because diodes, a current extracting section and a comparison section can be installed in an integrated circuit with high accuracy.

PREFERRED EMBODIMENTS OF THE INVENTION

Now, the present invention will be more specifically described with reference to accompanying drawings.

Embodiment 1

Figure 1:
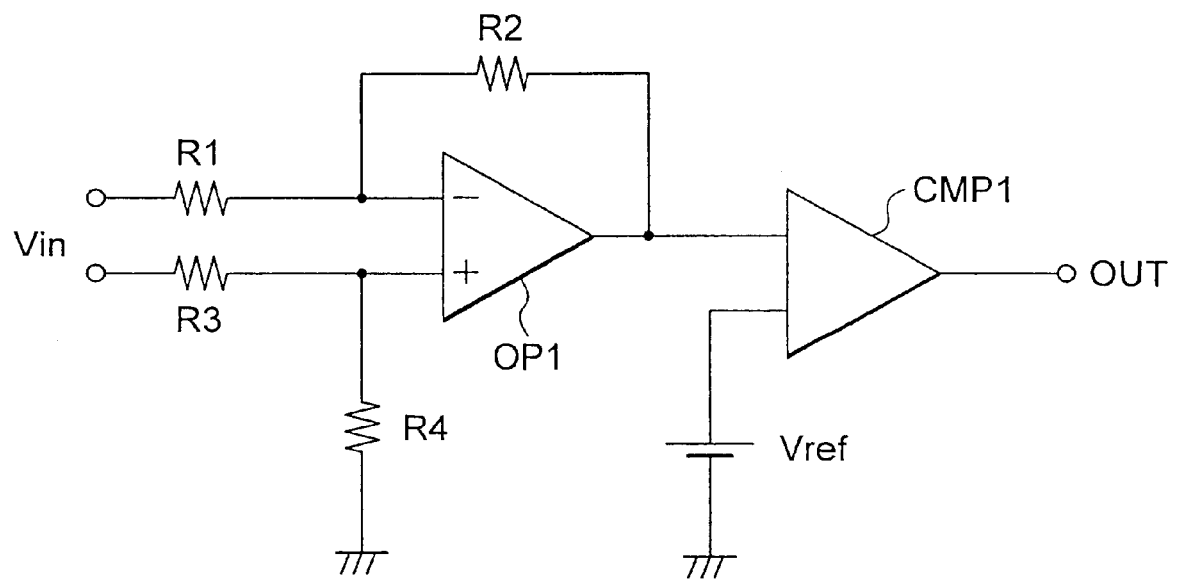
FIGS. 1 is a circuit diagram showing a conventional voltage judgment circuit for a battery.
Figure 2:
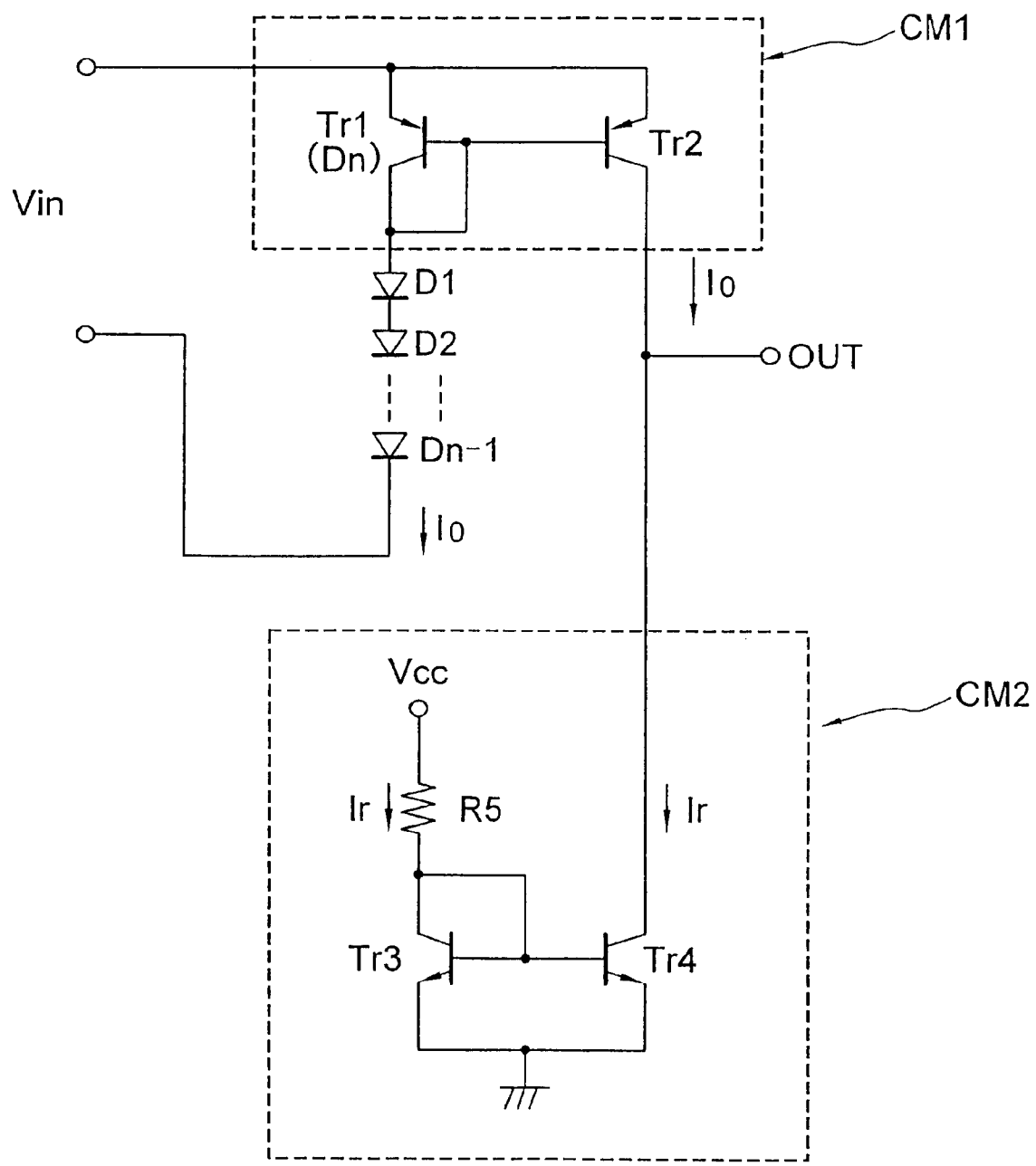
FIG. 2 is a circuit diagram showing a voltage judgment circuit of the present invention in accordance with a first Embodiment.

FIG. 2 is a circuit diagram showing a voltage judgment circuit of the present invention in accordance with a first Embodiment. A voltage judgment circuit of the present Embodiment has "n−1" diodes D1 to Dn−1 connected in series inserted in the forward direction of a judgment voltage, a first current mirror circuit CM1 for extracting a forward direction current of the diodes and a second current mirror circuit CM2 for obtaining and extracting a reference current.

Each of the diodes D1 to Dn−1 is formed by a diode-connected PNP transistor having a base and a collector connected with each other. The first current mirror circuit CM1 has a diode-connected first PNP transistor Tr1 of a reference side having a current path connected in series with the diodes D1 to Dn−1, and a second PNP transistor Tr2 of an output side having a base connected to the commonly connected base and collector of the first PNP transistor. Each of the "n−1" diodes D1 to Dn−1 have the same structure. The current characteristic of the diodes D1 to Dn is designed corresponding to the magnitude of the judgment voltage.

The second current mirror circuit CM2 has a diode-connected first NPN transistor Tr3 of the reference side having a resistance R5 connected in series for obtaining the reference current, and a second NPN transistor Tr4 of the output side having a base connected to the commonly connected base and collector of the first NPN transistor Tr3. The resistance R5 is prepared, for obtaining a high resistance value with high accuracy, as a resistance externally connected to an integrated circuit constituting the voltage judgment circuit. The current ratio between the reference side and the output side of the respective current mirror circuits CM1 and CM2 of this Embodiment is 1:1.

The voltage judgment circuit of this Embodiment operates as follows. The judgment voltage Vin is applied to the "n" diodes D1 to Dn connected in series in the forward direction, and the judged output is extracted from a connection node between the collectors of the second PNP transistor Tr2 and of the second NPN transistor Tr4. The judgment voltage Vin is converted into a forward direction current Io through the "n" diodes connected in series, and this current Io is extracted in the first current mirror circuit CM1 as a collector current of the second PNP transistor Tr2. On the other hand, the reference current Ir defined by the resistance R5 is also extracted in the second current mirror circuit CM2 as a collector current of the second NPN transistor Tr4.

When the judgment voltage Vin is lower than a specified voltage Vref, the forward direction current Io is lower than the reference current Ir, and the potential of an output terminal (OUT) becomes a grounded lower side potential. That is, "L" is output from the output terminal (OUT). When judgment voltage Vin becomes higher than the specified voltage Vref, the forward direction current Io becomes higher than the reference current Ir so that the potential of the output terminal (OUT) becomes a higher side potential Vcc. That is, "H" is output from the output terminal (OUT).

The current characteristics of the respective diodes D1 to Dn are determined by a specified judgment voltage $V_T$, the number of the diodes connected in series and the relation with the comparison current Ir. The forward direction voltage drop $V_F$ of the respective diodes equals to $V_F=V_T/n$, and the $V_F$ can be calculated by employing an equation of $V_F=(kT/q) \ln(Ir/Is)$. In this equation, Ir is the reference current, Is is a reverse saturation current, k is a Boltzmann's constant, T is an absolute temperature, and q is an electric charge amount, $1.6\times10^{-19}$ coulomb.

In case of T=300K(27° C.), kT/q=0.0259 V. The reference current is determined by the selection of the resistance R5, and for example, when the resistance R5 is 4 Mohm and the power supply voltage Vcc is $4V+V_{BE}$, the reference current Ir becomes 1 micron A. When the judged voltage $V_T$ is 4.2 V and "n" equals to 7, $V_F$=0.6 V. In this case, the reverse saturation current may be made to be $8.7\times10^{-17}$ A. The reverse saturation current Is of a transistor is arbitrary established by changing an emitter size during manufacture of an integrated circuit.

Figure 3:
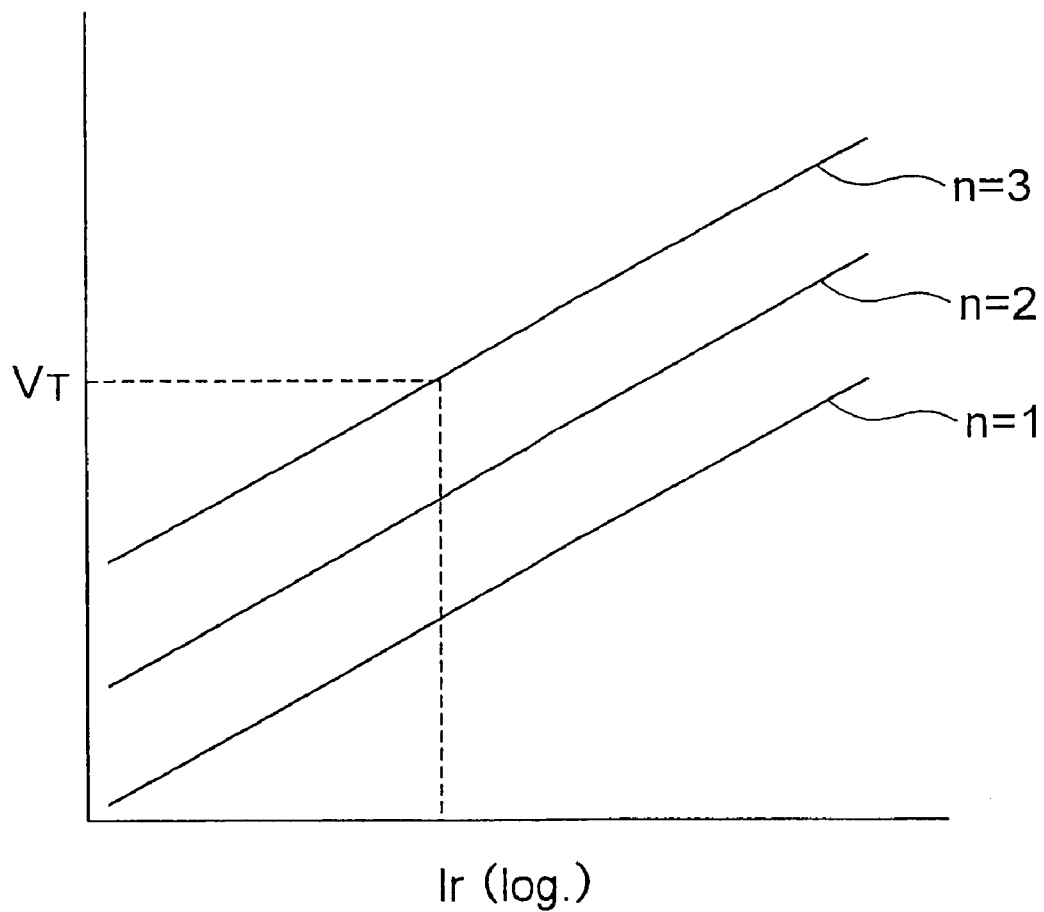
FIG. 3 is graph for searching for a reference current.

FIG. 3 is a graph showing the relation between the reference current Ir required for obtaining a desired judged voltage $V_T$ and the number of the diodes "n" connected in series. When the scale of the reference current is made logarithmic, the linear relation shown therein is obtained. One order change of Ir changes the judged voltage by about 60 mV. The resistance R5 is established by Ir thus determined.

A large current does not flow in the diodes until the forward direction voltage of the diodes reaches to a specified voltage in the voltage judgment circuit of the above Embodiment. Since no grounded section exists in the voltage judgment circuit, no circulation current flows between the terminal and the ground to enable the reduction of the of the consumption current compared with a conventional circuit even if the lower potential side terminal is employed for the judgment of a terminal voltage at a specific voltage in a battery cell pack. Since, further, the reverse saturation current of the transistor can be established with the high accuracy, an exact forward direction voltage of the diode can be obtained so that the voltage judgment can be performed with the high accuracy. Since the externally connected resistance required to have a high accuracy resistance value is only the resistance R5, the circuit scale can be made smaller.

Embodiment 2

Figure 4:
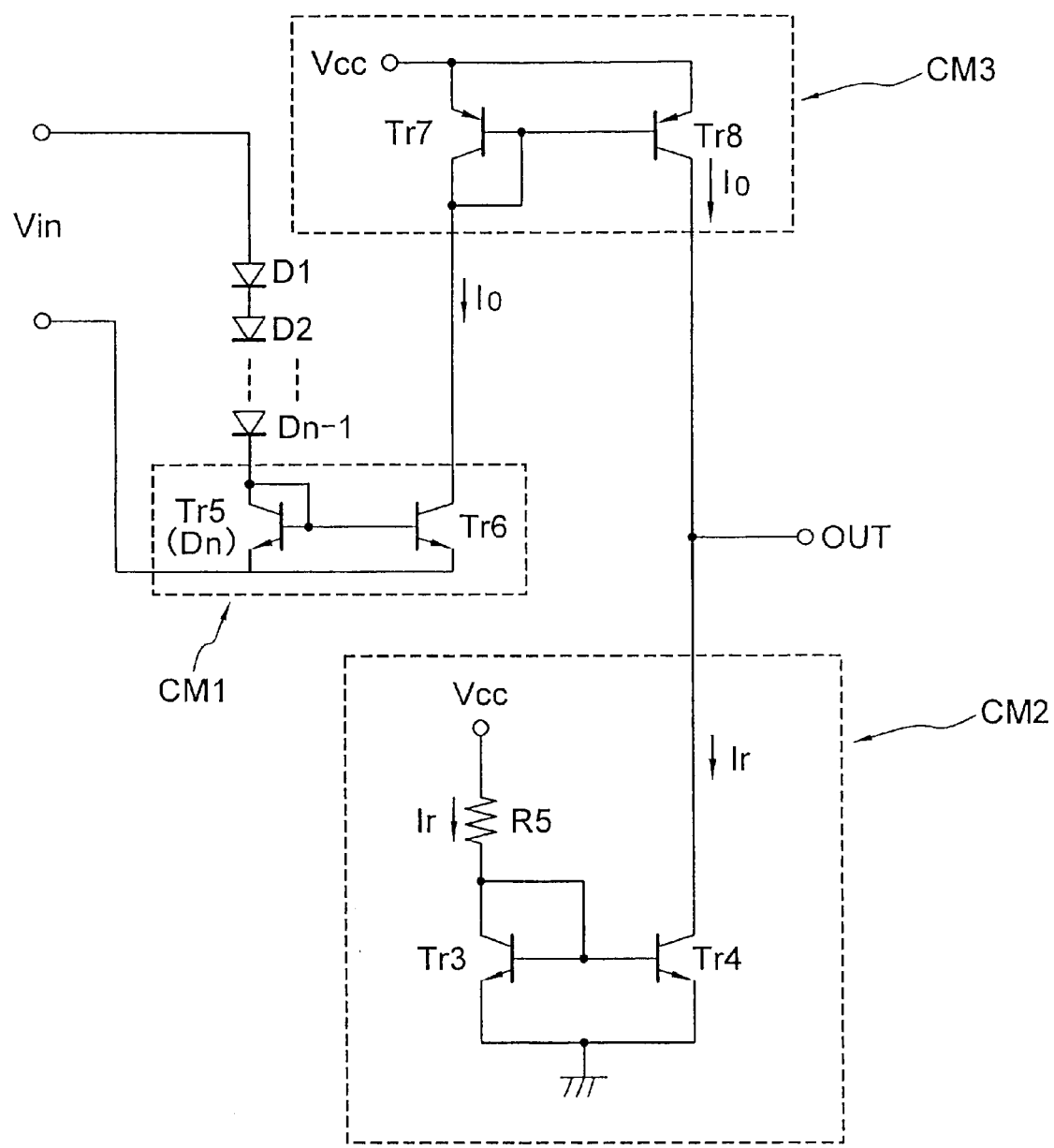
FIG. 4 is a circuit diagram showing a voltage judgment circuit of the present invention in accordance with a second Embodiment.

FIG. 4 is a circuit diagram showing a voltage judgment circuit of a second Embodiment. The voltage judgment circuit of the present Embodiment is different from that of the first Embodiment in that NPN transistors are employed as the diodes D1 to Dn and as the first current mirror circuit CM1, a third current mirror circuit CM3 is formed between the first current mirror circuit CM1 and the second current mirror circuit CM2, and an output terminal (OUT) is formed at a connection node between an output side transistor Tr8 of the third current mirror circuit CM3 and the output side transistor Tr4 of the second current mirror circuit CM3.

Since, in case of employing a plurality of the voltage judgement circuits, the respective "H" levels of the outputs of each of the voltage judgment circuits can be made to be the same high potential Vcc by constituting the diodes D1 to Dn by the NPN transistors in the voltage judgment circuit of the present Embodiment, the constitution of a next stage circuit can be made simpler.

Figure 5:
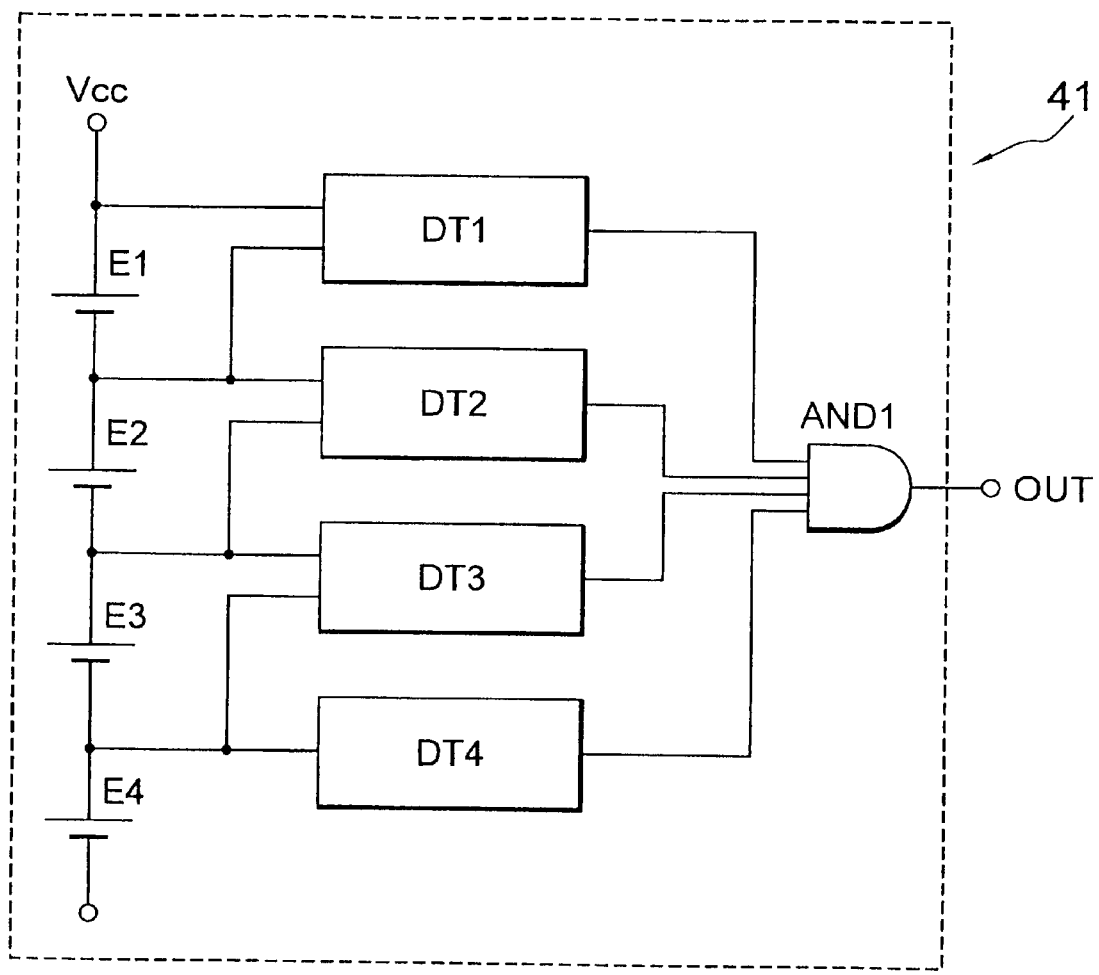
FIG. 5 is a circuit diagram showing a battery cell pack in accordance with a third Embodiment.

FIG. 5 is a circuit diagram showing a battery cell pack in accordance with a third Embodiment having the voltage judgment circuits of the above Embodiments.

A battery cell pack 41 has a power supply formed by four lithium battery cells E1 to E4 connected in series having a terminal voltage of 4 V. The battery cell pack 41 further has four voltage judgment circuit DT1 to DT4 arranged corresponding to the respective battery cells E1 to E4 for judging whether or not the terminal voltages of the battery cells reach to a specified voltage, and an AND gate AND1 for the respective voltage judgment circuits DT1 to DT4.

Since the outputs of the respective voltage judgment circuits DT1 to DT4 are "H" in an ordinary state, the output of the AND gate AND1 is "H". When the terminal voltages of the lithium battery cells increase with the progress of the charging and one of the terminal voltages becomes higher than the specified voltage, the output of the corresponding voltage judgment circuit becomes "L" and the output of the AND gate also becomes "L". This signal "L" stops the charging of the battery cell pack by means of the charging circuits.

Since the above embodiments are described only for examples, the present invention is not limited to the above embodiments and various modifications or alternations can be easily made therefrom by those skilled in the art without departing from the scope of the present invention.

What is claimed is:

1. A voltage judgment circuit comprising one or more diodes connected in a forward direction of a voltage to be judged, a current extraction section for extracting a forward current of said diodes, a comparison section for comparing an output current from said current extracting section against a specified current and an output section for outputting a control signal based on the result of comparison.

2. The circuit as defined in claim 1, wherein said current extraction section comprises a first current mirror circuit having a first transistor in a reference side connected in series with said diodes and a second transistor in an output side.

3. The circuit as defined in claim 1, wherein said comparison section comprises a second current mirror circuit having a third transistor in a reference side thereof and a fourth transistor in an output side connected in series with said second transistor.

4. The circuit as defined in claim 1, wherein said diode is implemented by a transistor having the same structure as said first transistor.

5. A battery cell pack comprising a plurality of batteries connected in series, and a plurality of said voltage judgment circuits as defined in claim 1 arranged corresponding to the respective batteries for judging terminal voltages of said batteries.

6. The battery cell pack as defined in claim 5, wherein a plurality of said voltage judgment circuits are mounted on one chip.

* * * * *

UNITED STATES PATENT AND TRADEMARK OFFICE
CERTIFICATE OF CORRECTION

PATENT NO. : 6,091,226
DATED : July 18, 2000
INVENTOR(S) : Nobutaka Amano

It is certified that error appears in the above-identified patent and that said Letters Patent is hereby corrected as shown below:

Title page,
Item [56], References Cited, U.S. PATENT DOCUMENTS:
"3/1996" should read -- 12/1993 --
"11/1992" should read -- 6/1998 --
"3/1998" should read -- 7/1993 --
"12/1990" should read -- 8/1989 --

Column 1,
Line 46, "comparison" should read -- judgement --

Column 3,
Line 36, "10" should read --Io --

Signed and Sealed this

Ninth Day of October, 2001

Attest:

NICHOLAS P. GODICI
Attesting Officer  Acting Director of the United States Patent and Trademark Office